US011404442B2

(12) United States Patent
Huo et al.

(10) Patent No.: US 11,404,442 B2
(45) Date of Patent: Aug. 2, 2022

(54) PROTECTIVE STRUCTURE AND FABRICATION METHODS FOR THE PERIPHERAL CIRCUITS OF A THREE-DIMENSIONAL MEMORY

(71) Applicant: Yangtze Memory Technologies Co., Ltd., Hubei (CN)

(72) Inventors: Zongliang Huo, Hubei (CN); Wenbin Zhou, Hubei (CN); Zhiguo Zhao, Hubei (CN); Zhaoyun Tang, Hubei (CN); Hai Lin Xiong, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 103 days.

(21) Appl. No.: 16/919,522

(22) Filed: Jul. 2, 2020

(65) Prior Publication Data

US 2020/0335521 A1 Oct. 22, 2020

Related U.S. Application Data

(60) Division of application No. 16/166,655, filed on Oct. 22, 2018, now Pat. No. 10,756,113, which is a (Continued)

(30) Foreign Application Priority Data

Nov. 23, 2017 (CN) ......................... 201711183467.4

(51) Int. Cl.
*H01L 27/11595* (2017.01)
*H01L 27/11575* (2017.01)
*H01L 27/11548* (2017.01)

(52) U.S. Cl.
CPC .. *H01L 27/11595* (2013.01); *H01L 27/11548* (2013.01); *H01L 27/11575* (2013.01)

(58) Field of Classification Search
CPC ......... H01L 27/11595; H01L 27/11548; H01L 27/11575
(Continued)

(56) References Cited

U.S. PATENT DOCUMENTS 5,872,035 A 2/1999 Kim et al.
6,413,821 B1 7/2002 Ebina et al.
(Continued)

FOREIGN PATENT DOCUMENTS

CN 1170959 A 1/1998
CN 1943037 A 4/2007
(Continued)

OTHER PUBLICATIONS

International Search Report and Written Opinion of the International Searching Authority directed to related International Patent Application No. PCT/CN2018/107885, dated Jan. 4, 2019; 8 pages.

*Primary Examiner* — Dzung Tran
(74) *Attorney, Agent, or Firm* — Sterne, Kessler, Goldstein & Fox P.L.L.C.

(57) ABSTRACT

Embodiments of a semiconductor memory device include a substrate having a first region with peripheral devices, a second region with one or more memory arrays, and a third region between the first and the second regions. The semiconductor memory device also includes a protective structure for peripheral devices. The protective structure for peripheral devices of the semiconductor memory device includes a first dielectric layer and a barrier layer disposed on the first dielectric layer. The protective structure for peripheral devices of the semiconductor memory device further includes a dielectric spacer formed on a sidewall of the barrier layer and a sidewall of the first dielectric layer, wherein the protective structure is disposed over the first region and at least a portion of the third region.

20 Claims, 10 Drawing Sheets

Related U.S. Application Data continuation of application No. PCT/CN2018/107885, filed on Sep. 27, 2018.

(58) Field of Classification Search
USPC .......................................................... 257/345
See application file for complete search history.

(56) References Cited

U.S. PATENT DOCUMENTS

| | | | | |
|---|---|---|---|---|
| 7,612,402 | B2 | 11/2009 | Shiba | |
| 8,969,929 | B2 | 3/2015 | Sakanishi et al. | |
| 9,276,010 | B2 | 3/2016 | Chuang et al. | |
| 9,589,976 | B2 | 3/2017 | Tseng et al. | |
| 10,332,882 | B2 | 6/2019 | Chuang et al. | |
| 2001/0054727 | A1 | 12/2001 | Hofmann et al. | |
| 2003/0057505 | A1 * | 3/2003 | Ebina | H01L 27/11573 257/411 |
| 2003/0181000 | A1 | 9/2003 | Mori | |
| 2004/0046185 | A1 | 3/2004 | Sashida | |
| 2004/0135192 | A1 | 7/2004 | Kasuya | |
| 2004/0185634 | A1 * | 9/2004 | Lim | H01L 28/57 438/396 |
| 2005/0029574 | A1 | 2/2005 | Jeon | |
| 2005/0116273 | A1 * | 6/2005 | Inoue | H01L 27/1052 257/296 |
| 2006/0170030 | A1 * | 8/2006 | Maruo | H01L 27/11521 257/315 |
| 2007/0201272 | A1 | 8/2007 | Okazaki | |
| 2007/0259494 | A1 * | 11/2007 | Park | H01L 21/76838 438/238 |
| 2015/0187783 | A1 | 7/2015 | Chuang et al. | |
| 2015/0348987 | A1 * | 12/2015 | Lee | H01L 27/11573 257/326 |
| 2019/0157298 | A1 | 5/2019 | Huo et al. | |

FOREIGN PATENT DOCUMENTS

| | | | |
|---|---|---|---|
| CN | 101582429 | A | 11/2009 |
| CN | 102569393 | A | 7/2012 |
| CN | 104752428 | A | 7/2015 |
| CN | 105097819 | A | 11/2015 |
| CN | 105355600 | A | 2/2016 |
| CN | 106057661 | A | 10/2016 |
| CN | 107346759 | A | 11/2017 |
| KR | 20040026500 | A | 3/2004 |
| WO | WO 2016/022319 | A2 | 2/2016 |

* cited by examiner

PROTECTIVE STRUCTURE AND FABRICATION METHODS FOR THE PERIPHERAL CIRCUITS OF A THREE-DIMENSIONAL MEMORY

INCORPORATION BY REFERENCE

This application is a divisional of U.S. patent application Ser. No. 16/166,655, titled "Protective Structure and Fabrication Methods for the Peripheral Circuits of A Three-Dimensional Memory," filed on Oct. 22, 2018, which claims priority to PCT/CN2018/107885 filed on Sep. 27, 2018, which claims priority to Chinese Patent Application No. 201711183467.4, filed on Nov. 23, 2017, all of which are incorporated herein by reference in their entirety.

TECHNICAL FIELD

The present disclosure generally relates to the field of semiconductor technology, and more particularly, to a method for forming a three-dimensional (3D) memory.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

BRIEF SUMMARY

Embodiments of a protective structure for peripheral circuits of a three-dimensional (3D) memory device and methods for forming the same are described in the present disclosure.

In some embodiments, a method for protecting peripheral circuits of a memory device is described. The method includes forming peripheral devices in a periphery region on a substrate. The method also includes disposing a first protective layer on the peripheral devices and then disposing a barrier layer on the first protective layer. The method further includes removing a portion of the barrier layer and the first protective layer and exposing a portion of the top surface of the substrate in a memory array. The method also includes disposing a second protective layer on the remaining barrier layer and the exposed portion of the top surface of the substrate. The method further includes etching the second protective layer and forming a protective spacer.

In some embodiments, the disposing of the first protective layer includes depositing silicon nitride on the peripheral devices using chemical vapor deposition.

In some embodiments, the disposing of the barrier layer includes depositing silicon dioxide using chemical vapor deposition.

In some embodiments, the removing of the portion of the barrier layer and the first protective layer and exposing the portion of the top surface of the substrate in the memory array includes techniques such as dry etching.

In some embodiments, the disposing of the second protective layer on the remaining barrier layer and the exposed portion of the top surface of the substrate includes depositing silicon nitride using chemical vapor deposition, PVD, sputtering, ALD or any chemical vapor deposition using a furnace system.

In some embodiments, the protective spacer has a thickness between about 40 nm to about 60 nm.

In some embodiments, a protective structure for peripheral circuits includes a substrate with peripheral devices, a first protective layer disposed on top of the peripheral devices, a barrier layer disposed on top of the first protective layer, and a protective spacer on a sidewall of the barrier layer, wherein the protective spacer and the first protective layer are adjacent to each other.

In some embodiments, the barrier layer includes a slanted sidewall.

In some embodiments, the dielectric spacer includes silicon nitride formed on the slanted sidewall of the barrier layer.

In some embodiments, the dielectric spacer has a thickness between about 40 nm to about 60 nm.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
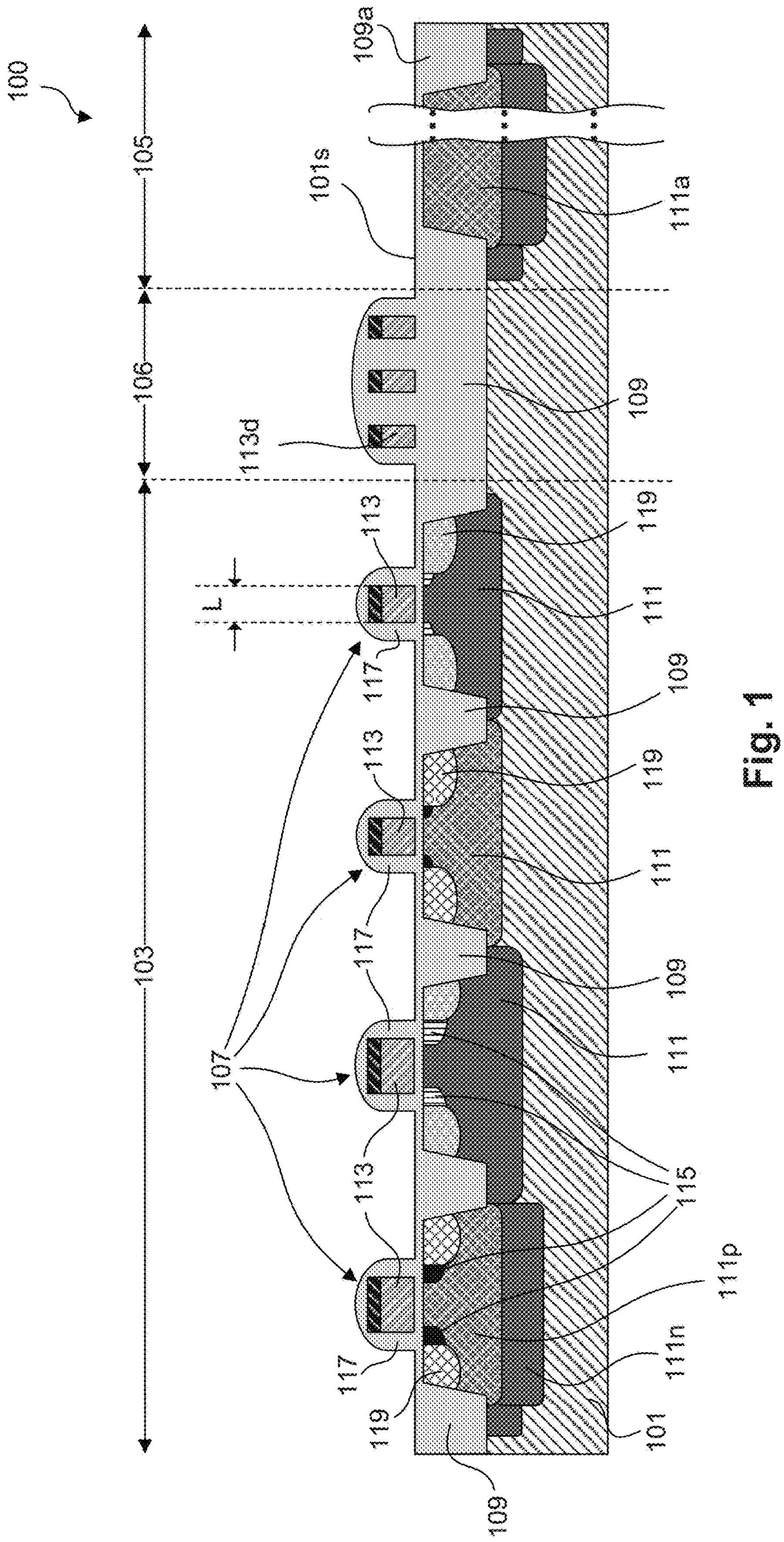
FIG. 1 illustrates a schematic cross-section view of an exemplary three-dimensional (3D) memory structure including a periphery, an array and a boundary, in accordance with some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to “one embodiment,” “an embodiment,” “an example embodiment,” “some embodiments,” etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term “one or more” as used herein, depending at least in part upon context, can be used to describe any feature, structure, or characteristic in a singular sense or can be used to describe combinations of features, structures or characteristics in a plural sense. Similarly, terms, such as “a,” “an,” or “the,” again, can be understood to convey a singular usage or to convey a plural usage, depending at least in part upon context. In addition, the term “based on” can be understood as not necessarily intended to convey an exclusive set of factors and may, instead, allow for existence of additional factors not necessarily expressly described, again, depending at least in part on context.

It should be readily understood that the meaning of “on,” “above,” and “over” in the present disclosure should be interpreted in the broadest manner such that “on” not only means “directly on” something, but also includes the meaning of “on” something with an intermediate feature or a layer therebetween. Moreover, “above” or “over” not only means “above” or “over” something, but can also include the meaning it is “above” or “over” something with no intermediate feature or layer therebetween (i.e., directly on something).

Further, spatially relative terms, such as “beneath,” “below,” “lower,” “above,” “upper,” and the like, can be used herein for ease of description to describe one element or feature’s relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term “substrate” refers to a material onto which subsequent material layers are added. The substrate includes a top surface and a bottom surface. The top surface of the substrate is where a semiconductor device is formed, and therefore the semiconductor device is formed at a top side of the substrate. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term “layer” refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term “nominal/nominally” refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term “about” indicates the value of a given quantity that can vary based on a particular technology node associated with the subject semiconductor device. Based on the particular technology node, the term “about” can indicate a value of a given quantity that varies within, for example, 10-30% of the value (e.g., ±10%, ±20%, or ±30% of the value).

In the present disclosure, the term “horizontal/horizontally/lateral/laterally” means nominally parallel to a lateral surface of a substrate. In the present disclosure, the term “each” may not only necessarily mean “each of all,” but can also mean “each of a subset.”

As used herein, the term “3D memory” refers to a three-dimensional (3D) semiconductor device with vertically oriented strings of memory cell transistors (referred to herein as “memory strings,” such as NAND strings) on a laterally-oriented substrate so that the memory strings extend in the vertical direction with respect to the substrate. As used herein, the term “vertical/vertically” means nominally perpendicular to the lateral surface of a substrate.

In some embodiments, a NAND string of a 3D memory includes a semiconductor pillar (e.g., silicon channel) that extends vertically through a plurality of conductor/dielectric layer pairs. The plurality of conductor/dielectric layer pairs are also referred to herein as an "alternating conductor/dielectric stack." An intersection of the conductor layer and the semiconductor pillar can form a memory cell. The conductor layer of the alternating conductor/dielectric stack can be connected to a word line at the back-end-of-line, where a word line can electrically connect one or more control gates. The top of the semiconductor pillar (e.g., transistor drain region) can be connected to a bit line (electrically connecting one or more semiconductor pillars). Word lines and bit lines are typically laid perpendicular to each other (e.g., in rows and columns, respectively), forming an array of the memory. A memory device may have one or more array blocks. An array block can also be divided into smaller array segments. The array blocks are the core area in a memory device, performing storage functions. To achieve higher bit density, the number of vertical 3D memory stacks is increased greatly, adding complexity and cost in manufacturing.

A memory device has another region, called the periphery, which provides supporting functions to the core. The periphery region includes many digital, analog, and/or mixed-signal circuits, for example, row and column decoders, drivers, page buffers, sense amplifiers, timing and controls, and the like circuitry. Peripheral circuits use active and/or passive semiconductor devices, such as transistors, diodes, capacitors, resistors, etc., as would be apparent to a person of ordinary skill in the art.

To achieve the performance and reliability requirements and/or to accommodate the high aspect ratio of 3D memory array stacks, the peripheral devices are fabricated first on a substrate, followed by processes to form the 3D memory arrays. Finally, the electrical contact structures to the peripheral devices and the memory cells are formed and a 3D memory device is completed with the back-end-of-line metal connections.

During the fabrication of 3D memory array, chemical gases, for example $NH_3$, $O_2$, $CH_4$, $SiH_4$, etc., are used for various film deposition or etching. At high temperature (e.g., 700° C. and above) or in the presence of strong electric field (e.g., high DC or RF bias), gaseous substances can be ionized and produce large amount of ions, such as hydrogen ($H^+$) or oxygen ($O^{2-}$), etc. Peripheral devices can be protected by one or more dielectric layers prior to the processes for 3D memory arrays.

To reduce cost per bit, the dimensions of critical features are aggressively scaled down, including the total area of periphery and the boundary area between periphery and core, because these areas do not contribute to the memory capacity. Periphery devices can suffer performance and/or reliability degradations if they are too close to a 3D memory array block. For example, higher leakage current and/or threshold voltage ($V_t$) shift in MOSFETs (metal oxide semiconductor field effect transistor) can be problematic. Such effects may be due to the lateral diffusion of ions or particles (for example $H^+$ or $O^{2-}$) along the boundary interface of the protective dielectric layers during the high temperature processes for memory arrays. The amount of change in device performance and/or reliability depends on the circuit layout and the distance from the peripheral device to a memory array, as well as process conditions (such as temperature, gas concentration, etc.) used in the fabrication of the memory arrays, leading to uncertainties of peripheral circuit performance and memory functionality.

Various embodiments in the present disclosure provide methods and structures for protecting the peripheral circuits and devices for a 3D memory device. In the present disclosure, an additional dielectric spacer is formed on sidewalls of the protective dielectric layers, preventing possible diffusion or corrosion of ions or particles during subsequent processes. Accordingly, the disclosed methods and structures can improve the performance and reliability of peripheral circuits in chip design and manufacturing in general.

FIG. 1 illustrates a schematic cross-sectional view of an exemplary three-dimensional (3D) memory structure 100, wherein the 3D memory structure includes a substrate 101, having a first region 103 with peripheral devices, a second region 105, and a third region 106 between the first region 103 and the second region 105. As used herein, the first region also refers to a "periphery" or a "peripheral region" of the memory, and the second region also refers to an "array", "array block" or "array region" of the memory (one or more array blocks may be formed in this region). As used herein, the third region also refers to a "boundary," an area between the periphery 103 and the array 105 of the memory.

The forming of the 3D memory structure 100 includes forming peripheral devices in the periphery 103, forming active device areas in the array 105, and forming one or more isolation structures in the boundary 106 on the substrate 101, according to some embodiments of the present disclosure.

In some embodiments, the substrate 101 used for the 3D memory structure 100 includes any suitable material for supporting the 3D memory device. For example, the substrate 101 can include silicon, silicon germanium (SiGe), silicon carbide, silicon on insulator (SOI), germanium on insulator (GOI), glass, gallium nitride, gallium arsenide, etc., and/or combinations thereof.

The periphery 103 can include any suitable semiconductor devices, for example, metal oxide semiconductor field effect transistors (MOSFETs), diodes, resistors, capacitor, etc. The semiconductor devices in the periphery 103 can be used in the design of digital, analog and/or mixed signal circuits supporting the storage function of memory core, for example, row and column decoders, drivers, page buffers, sense amplifiers, timing and controls. Among the semiconductor devices, p-type and/or n-type MOSFETs are widely implemented in peripheral circuit design, and are used as examples in the description of the present disclosure. The peripheral devices, however, are not limited to MOSFETs. The structures of the other peripheral devices, for example diodes, resistors, capacitors, inductors, etc., can be formed simultaneously during MOSFETs fabrication through different mask design and layout. To form peripheral devices other than MOSFETs, process steps can be added or modified in a MOSFET's process flow, for example, processes to obtain different dopant profiles, film thicknesses or material stacks, etc. In some embodiments, peripheral devices other than MOSFETs can also be fabricated with additional design and/or lithography mask levels to achieve specific circuit requirements.

A peripheral MOSFET 107 can be either a p-channel MOSFET or an n-channel MOSFET and can include, but not limited to, an active device region surrounded by shallow trench isolation (STI) 109 (also called isolation structure(s)), a well 111 formed in the active device region with n-type or p-type doping, a gate stack 113 that includes a gate dielectric, a gate conductor and/or a gate hard mask. The peripheral MOSFET 107 can also include a source/drain extension and/or halo region 115, a gate spacer 117 and a source/drain 119 locating on each side of the gate stack. The peripheral MOSFET 107 can further include a silicide contact area (not shown) in the top portion of the source/drain. Other known devices can be also formed in the peripheral region. The structure and fabrication methods of peripheral devices, for example, p-type and/or n-type MOSFETs, are known to those skilled in the art.

The STI 109 can be formed through patterning the substrate using lithography and etching, filling an insulating material and polishing the insulating material to form a coplanar surface on the substrate 101. An insulating material for STI 109 can include silicon oxide, silicon oxynitride, TEOS, low-temperature oxide (LTO), high temperature oxide (HTO), silicon nitride, etc. An insulating material for STI 109 can be disposed using techniques such as chemical vapor deposition (CVD), physical vapor deposition (PVD), plasma-enhanced CVD (PECVD), low pressure chemical vapor deposition (LPCVD), high density plasma (HDP) chemical vapor deposition, rapid thermal chemical vapor deposition (RTCVD), metal organic chemical vapor deposition (MOCVD), atomic layer deposition (ALD), sputtering, thermal oxidation or nitridation, CVD using a furnace system, any other suitable deposition method, and/or combinations thereof. The forming of STI 109 can also include a high temperature annealing step to densify the disposed insulating material for better electrical isolation. Other STI structures can be employed, as would be apparent to a person of ordinary skill in the art.

The peripheral MOSFET 107 is surrounded by STI 109 in the plane parallel to the surface of the substrate 101. The depth of STI and/or the depth of the well 111 determines the vertical dimension of the active device region of the peripheral MOSFET 107. The active device region of the peripheral MOSFET 107 can have a thickness of more than about 200 nm on the substrate 101. In some embodiments, the active device region of the peripheral MOSFET 107 can have a thickness of less than about 200 nm on substrate 101. For example, the active device region of the peripheral MOSFET can be the thickness of the top semiconductor thickness on an SOI substrate, and can be less than about 50 nm, where the underlying buried oxide serves as additional device isolation.

The well 111 of the peripheral MOSFET 107 can include a p-type doping for n-channel MOSFET and an n-type doping for p-channel MOSFET, and is called p-well and n-well, respectively. The dopant profile and concentration of the well 111 affects the device characteristics of the peripheral MOSFET 107. For MOSFET devices with low threshold voltage ($V_t$), the well 111 can be doped with lower concentration, and can form low-voltage p-well or low-voltage n-well. For MOSFET with high $V_t$, the well 111 can be doped with higher concentration, and can form high-voltage p-well or high-voltage n-well. In some embodiments, to provide electrical isolation from p-type substrate 101, a deep n-well 111*n* can be formed underneath a high-voltage p-well 111*p* for an n-channel MOSFET with high $V_t$.

The forming of an n-well can include any suitable n-type dopant, such as phosphorus, arsenic, antimony, etc., and/or any combination thereof. The forming of a p-well can include any suitable p-type dopant, for example boron. The dopant incorporation can be achieved through ion implantation followed by activation anneal, or through in-situ doping during epitaxy for the active device region.

The gate stack 113 of the peripheral MOSFET 107 can be formed by a "gate first" scheme, where the gate stack 113 is disposed and patterned prior to source/drain formation. The gate stack 113 of the peripheral MOSFET 107 can also be formed by a "replacement" scheme, where a sacrificial gate stack can be formed first and then replaced by a high-k dielectric layer and a gate conductor after source/drain formation.

In some embodiments, the gate dielectric can be made of silicon oxide, silicon nitride, silicon oxynitride, and/or high-k dielectric films such as hafnium oxide, zirconium oxide, aluminum oxide, tantalum oxide, magnesium oxide, or lanthanum oxide films, and/or combinations thereof. The gate dielectric can be disposed by any suitable methods such as CVD, PVD, PECVD, LPCVD, RTCVD, sputtering, MOCVD, ALD, thermal oxidation or nitridation, CVD using a furnace system, any other suitable deposition method, and/or combinations thereof.

In some embodiments, the gate conductor can be made from a metal, such as tungsten, cobalt, nickel, copper, or aluminum, and/or combinations thereof. In some embodiments, the gate conductor can also include a conductive material, such as titanium nitride (TiN), tantalum nitride (TaN), etc. The gate conductor can be formed by any suitable deposition methods, for example, sputtering, thermal evaporation, e-beam evaporation, ALD, PVD, and/or combinations thereof.

In some embodiments, the gate conductor can also include a poly-crystalline semiconductor, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, or arsenic, etc. In some embodiments, the gate conductor can also be an amorphous semiconductor.

In some embodiments, the gate conductor can be made from a metal silicide, including $WSi_x$, $CoSi_x$, $NiSi_x$, or $AlSi_x$, etc. The forming of the metal silicide material can include forming a metal layer and a poly-crystalline semiconductor using similar techniques described above. The forming of metal silicide can further include applying a thermal annealing process on the deposited metal layer and the poly-crystalline semiconductor layer, followed by removal of unreacted metal.

The gate spacer 117 can be formed through disposing an insulating material and then performing anisotropic etching. The insulating material for the gate spacer 117 can be any insulator, including silicon oxide, silicon nitride, silicon oxyntiride, TEOS, LTO, HTO, etc. The gate spacer 117 can be disposed using techniques such as CVD, PVD, PECVD, LPCVD, RTCVD, MOCVD, ALD, sputtering, CVD using a furnace system, any other suitable deposition method, and/or combinations thereof. The anisotropic etching of the gate spacer 117 includes dry etching, for example reactive ion etching (ME).

A length L of the gate stack 113 between the source/drain 119 is an important feature of the MOSFET. The gate length L determines the magnitude of drive current of a MOSFET and is therefore scaled down aggressively for logic circuits. The gate length L can be less than about 100 nm. In some embodiments, the gate length can be in a range between about 5 nm to about 30 nm. Patterning of the gate stack with such a small dimension is very challenging, and can use techniques including optical proximity correction, double exposure and/or double etching, self-aligned double patterning, etc. In some embodiments, dummy gates 113*d* can be placed on the STI to improve pattern uniformity at wafer level. The dummy gate 113*d* can be made from the same materials and formed with the same processes as gate stack 113. However the dummy gate 113*d* do not provide electrical functions to the peripheral circuits.

In some embodiments, the source/drain 119 of the peripheral MOSFET 107 is incorporated with high concentration dopants. For n-type MOSFETs, the dopant for source/drain 119 can include any suitable n-type dopant, such as phosphorus, arsenic, antimony, etc., and/or any combination thereof. For p-type MOSFETs, the dopant for source/drain 119 can include any suitable p-type dopant, for example boron. The dopant incorporation can be achieved through ion implantation followed by dopant activation anneal. The source/drain 119 of a peripheral MOSFET can be made of the same material as the substrate 101, for example, silicon. In some embodiments, the source/drain 119 of a peripheral MOSFET 107 can be made of a different material from the substrate 101 to achieve high performance. For example, on a silicon substrate, the source/drain 119 for a p-type MOSFETs can include SiGe and the source/drain 119 for an n-type MOSFETs can include carbon incorporation. The forming of the source/drain 119 with a different material can include etching back the substrate material in the source/drain area and disposing new source/drain material using techniques such as epitaxy. Doping for source/drain 119 can also be achieved through in-situ doping during epitaxy.

The peripheral MOSFET 107 can also have an optional source/drain extension and/or halo region 115 along each side of the gate stack 113. The source/drain extension and/or halo region locates inside the active device region below the gate stack, and is implemented mainly for better short channel control for the peripheral MOSFET 107 with a channel length less than about 0.5 μm. The forming of the source/drain extension and/or halo region 115 can be similar to the forming of the source/drain 119, but may use different implantation conditions (e.g., dose, angle, energy, species, etc.) to obtain optimized doping profile, depth or concentration.

Because 3D memory devices operate under low signal-to-noise conditions, semiconductor devices in the periphery are required to have reliable performance and low leakage current. For example, in a sense amplifier, a peripheral transistor needs to have excellent threshold voltage ($V_t$) matching. In a row or column decoder, a transistor needs to provide higher bias to drive the memory elements. To achieve fast read and write from/to the memory array, periphery devices also need to have high performance (e.g., high drive current) with good short channel control.

To satisfy the requirements of different functions of peripheral circuits, MOSFETs with different structures and characteristics can be fabricated. For example, MOSFET with thicker gate dielectric layers (such as $SiO_2$ and/or $HfO_2$) can be implemented for applications with high voltage bias. In another example, gate stack can include a single work function metal and dual high-k dielectric material to make MOSFETs with different $V_t$.

The peripheral MOSFET 107 can be formed on the substrate 101 with a planar active device region (as shown in FIG. 1), where the direction of MOSFET's channel and current flow is parallel to the top surface of the substrate 101*s*. In some embodiments, the peripheral MOSFET 107 can also be formed on the substrates 101 with a 3D active device region, for example a so-called "FINFET" in a shape like a "FIN" (not shown), where the gate stack of the MOSFET is wrapped around the FIN, and the MOSFET's channel lies along three sides of the FIN (top and two sidewalls under the gate). The structure and methods for FINFET device are known to those skilled in the art and are not discussed further in present disclosure.

The structures and fabrication processes for the peripheral devices are not limited to the structures and processes described above. Other processing steps can be performed as well before, after, or between any of the said processes. The sequence of the said processes can also be in a different order and process steps can be omitted and in a combination of any form, as would be apparent to a person of ordinary skill in the art.

The array 105 of the 3D memory structure 100 (shown in FIG. 1), also includes one or more isolation structures such as STIs 109*a* and wells 111*a*. The STI 109*a* in the array 105 can be similar to the STI 109 in the periphery 103 and can be formed at the same time using the same processes. In some embodiments, the STI 109*a* in the array 105 can have a different depth or filling material than the STI 109 in the periphery 103 if the forming of STI 109*a* can be performed in separate process steps and/or using separate lithography masks. The active device region for the array 105 is surrounded by STI 109*a*, in the plane parallel to the top surface of the substrate 101*s*.

The well 111*a* is formed in the active device region of the array 105. The well 111*a* can include a high voltage p-well and deep n-well, similar to 111*p* and 111*n* for the n-channel MOSFETs with high $V_t$ in the periphery 103, and can be formed at the same time using the same processes. The well 111*a* in the array 105 can also have a different dopant profile (e.g., depth, concentration, dopant species, etc.) than the well 111 in the periphery 103, and can be formed through a separate implantation step and/or lithography mask. The array 105 can include one or more of the well 111*a*, wherein the wells 111*a* can be separated with one or more STIs 109*a*. The array 105 with a plurality of the wells 110*a* can have similar doping profiles or can have different doping profiles.

The boundary 106, separating the periphery 103 and the array 105, includes isolation structures such as STI 109. In some embodiments, the boundary 106 can also include dummy gates 113*d* to improve process variation at gate stack patterning. The dummy gate 113*d* does not provide electrical functions.

After completing the front-end-of-line processes for the periphery devices, 3D memory structure 100 in FIG. 1 is formed.

Figure 2:
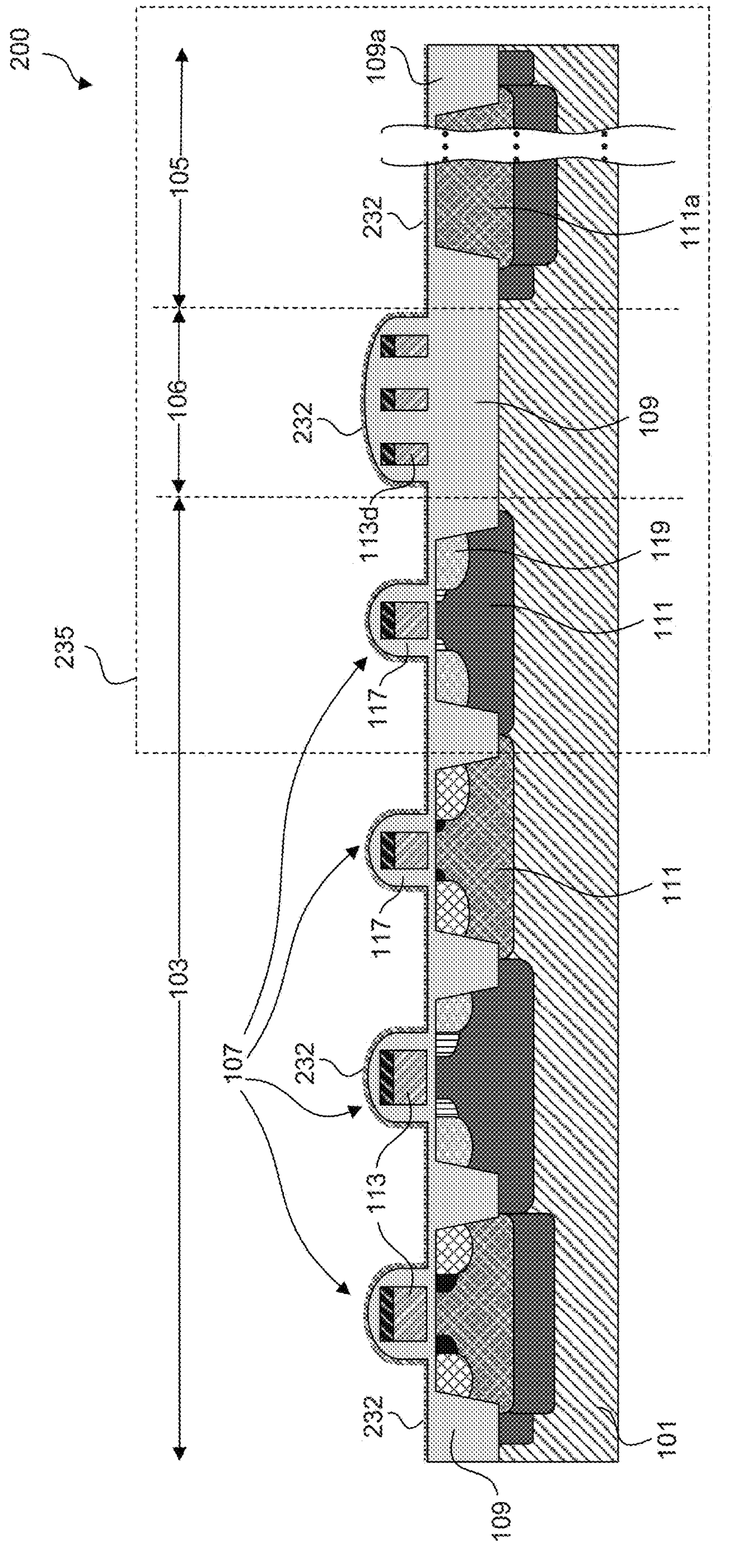
FIG. 2 illustrates a schematic cross-section view of an exemplary 3D memory structure covered with a first dielectric layer, in accordance with some embodiments of the present disclosure.

Referring to FIG. 2, a first dielectric layer 232 can be disposed over the 3D memory structure 100 (shown in FIG. 1) on the substrate 101, in the areas including the periphery 103, the boundary 106 and the array 105. As used herein, the first dielectric layer also refers to a "first protective layer." The first dielectric layer 232 can have a thickness in a range between about 10 nm to about 100 nm. In some embodiments, the first dielectric layer 232 has a thickness between about 20 nm to about 40 nm.

In some embodiments, the first dielectric layer 232 can include any suitable insulating materials, for example, silicon nitride or silicon oxynitride. In some embodiments, the first dielectric layer 232 can also include high-k dielectric materials, for example, hafnium oxide, zirconium oxide, aluminum oxide, tantalum oxide, or lanthanum oxide films.

The formation of the first dielectric layer 232 can include any suitable deposition methods such as, CVD, PVD, PECVD, LPCVD, RTCVD, sputtering, MOCVD, ALD, CVD using a furnace system, and/or combinations thereof.

The area 235 around the boundary 106 and the adjacent areas of the periphery 103 and the array 105 is the focus of the present disclosure, and will be illustrated in detail in FIG. 3-8 for the subsequent process steps. The peripheral MOSFET 107, dummy gate 113*d*, STI 109 and 109*a*, well 111*a* in the area 235 are shown for exemplary illustration purpose, and do not represent the exhaustive possibilities of other structures and/or devices near the boundary 106.

Figure 3:
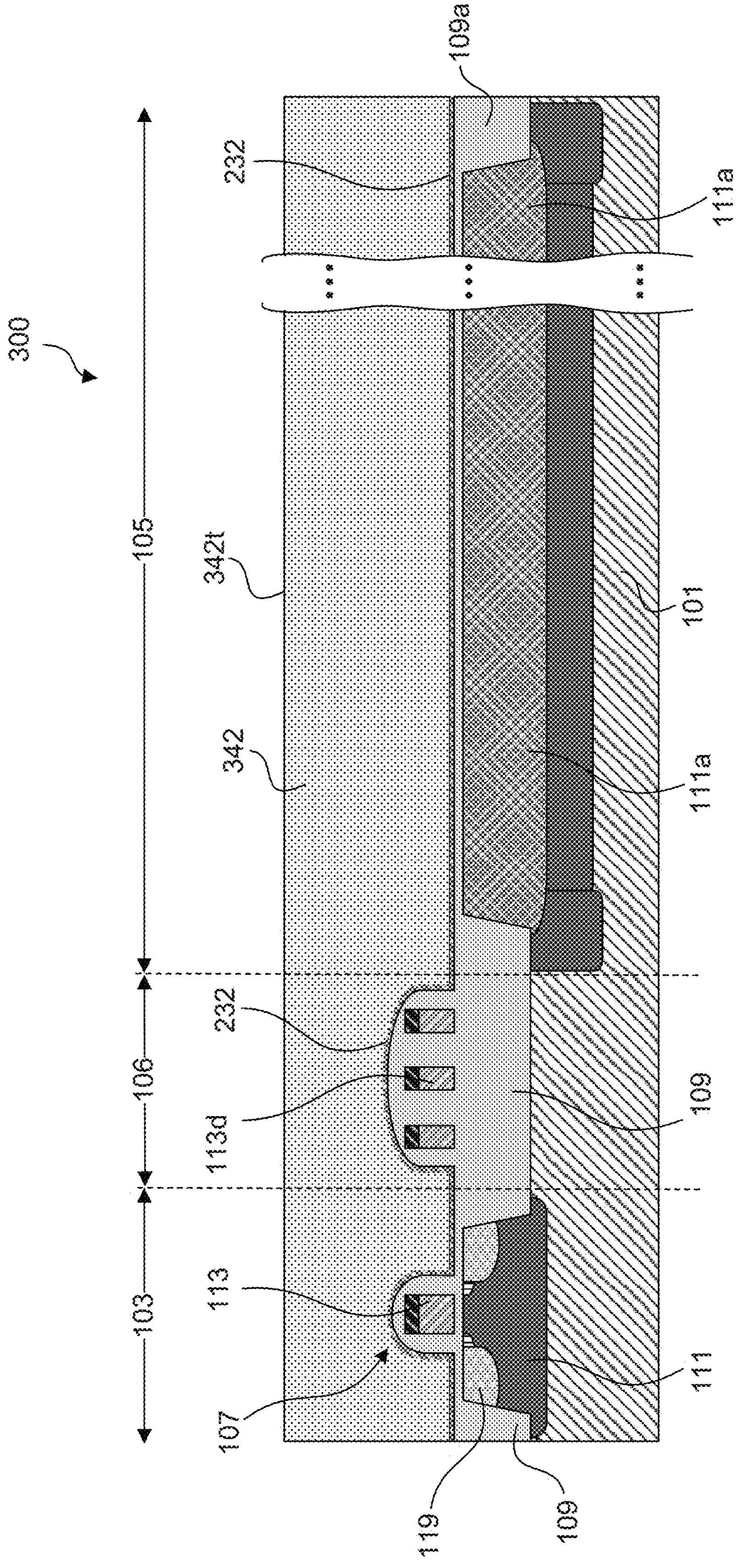
FIG. 3 illustrates a schematic cross-section view of an exemplary 3D memory structure covered with a barrier layer, in accordance with some embodiments of the present disclosure.

Referring to FIG. 3, a barrier layer 342 is disposed on top of the first dielectric layer 232. In some embodiments, a planarization process is implemented after disposing the barrier layer 342 to form a planar top surface 342*t* at wafer level. After planarization, the top surface 342*t* of the barrier layer 342 lies above the gate stack 113 and the dummy gate 113*d* in the periphery 103 or the boundary 106. The barrier layer 342 has a thickness in a range between about 0.2 μm to about 2 μm. In some embodiments, the thickness of the barrier layer 342 is in a range between about 0.5 μm to about 0.9 μm.

In some embodiments, the barrier layer 342 can include any suitable insulators that is different from the first dielectric layer 232, for example, silicon oxide, TEOS, spin-on-glass, boron or phosphorus doped silicon oxide, etc., and/or combinations thereof. The formation of the barrier layer 342 can include any suitable deposition methods such as CVD, PVD, PECVD, LPCVD, RTCVD, high-density-plasma (HDP) CVD, CVD using a furnace system, sputtering, spin-on coating, etc., and/or combinations thereof. The planarization process can include chemical mechanical polishing (CMP).

Figure 4:
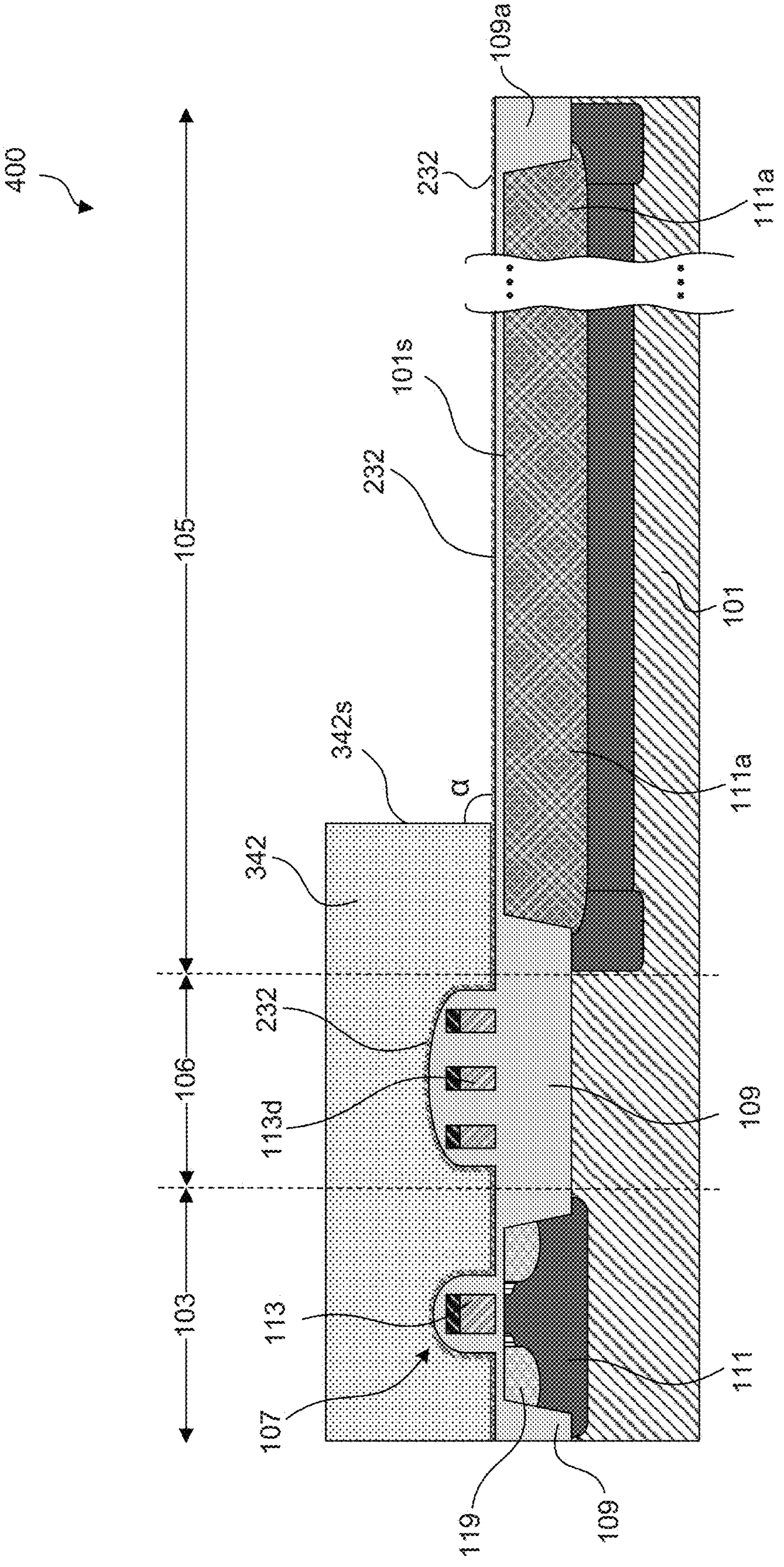
FIG. 4 illustrates a schematic cross-section view of an exemplary 3D memory structure with a portion of the barrier layer removed in the memory array, in accordance with some embodiments of the present disclosure.

Referring to FIG. 4, a portion of the barrier layer 342 in the memory array 105 is removed using lithography and etching, forming a sidewall of the barrier layer 342*s* and exposing a portion of the first dielectric layer 232. The mask (not shown) used for patterning the barrier layer 342 can include photoresist, a hard mask or combinations thereof. The patterning mask can be removed after etching the barrier layer 342, or can be kept as an etching mask in the next process step (shown in FIG. 5) and can be removed afterwards. The remaining portion of the barrier layer 342 covers at least an area including the periphery 103. In some embodiments, the remaining portion of the barrier layer 342 can also cover at least a portion of the boundary 106. In some embodiments, the remaining portion of the barrier layer 342 can further cover a portion of the active device region of the array 105, e.g., a portion of the well 111*a*.

In some embodiments, the sidewall of the barrier layer 342*s* can be straight, i.e. perpendicular to the top surface of the substrate 101*s*. In some embodiment, the angle α between the sidewall of the barrier layer 342*s* and the top surface of the substrate 101*s* can be slightly larger or smaller than 90 degrees. In some embodiments, the angle α can be in a range of 60 degrees to 120 degrees. The etching of the barrier layer 342 can include dry etching, for example, reactive ion etching (RIE) using etchant such as $CF_4$, $CHF_3$, $C_2F_6$, or $C_3F_6$, etc. In some embodiments, the etching of the barrier layer 342 can also include wet chemical etching, for example, HF, buffered-oxide-etchant (BOE), etc, in a combination with RIE. The etching process of the barrier layer 342 can be selective to the first dielectric layer 232. In the other words, the removing of the portion of the barrier layer 342 includes etching the barrier layer 342 at a first etching rate and etching the first dielectric layer 232 at a second etching rate, wherein the first etching rate is greater than the second etching rate. Therefore, during the etching process for the barrier layer 342, the first dielectric layer 232 can function as an etch stop layer. With an etch-stop, the top surface of the substrate 101*s* in the array 105 can avoid the exposure to the etching chemistry or plasma in the RIE chamber and can be protected from damaging during the pattering of the barrier layer 342.

Figure 5:
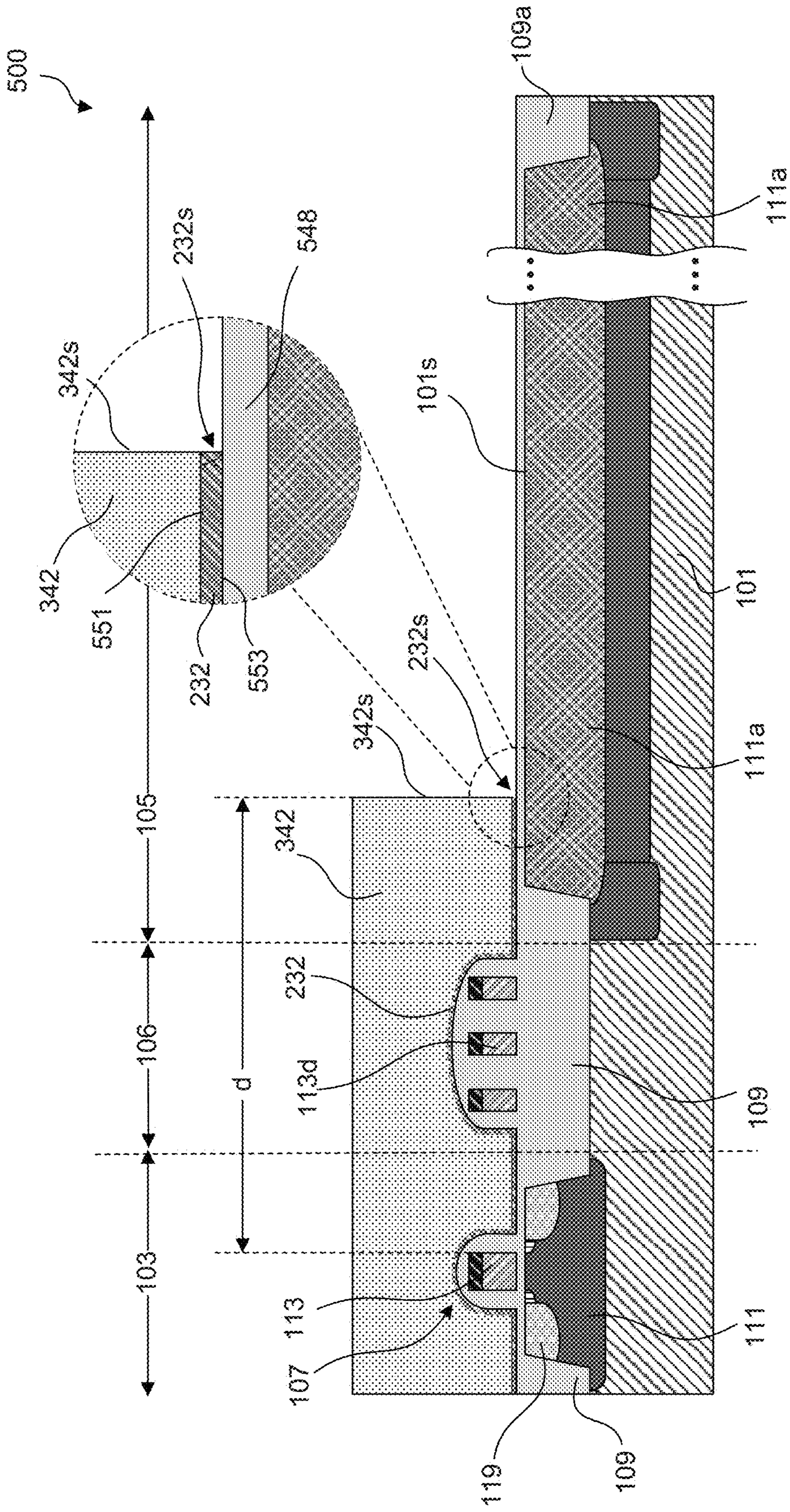
FIG. 5 illustrates a schematic cross-section view of an exemplary 3D memory structure with a portion of the first dielectric layer removed in the memory array, in accordance with some embodiments of the present disclosure.

Referring to FIG. 5, the exposed portion of the first dielectric layer 232 is removed to form a sidewall of the first dielectric layer 232*s* and a remaining portion of the first dielectric layer. A portion of the top surface of the substrate 101*s* in the memory array 105 is exposed. Accordingly, a 3D memory structure 500 is formed.

In some embodiments, the exposing of the top surface of the substrate 101*s* can include exposing a dielectric film 548 on the substrate 101*s*. The dielectric film 548 can be any dielectric material, for example silicon oxide, formed during processes for the peripheral devices for example, STI, gate dielectric or gate spacer, etc. In some embodiments, the exposing of the top surface of the substrate 101*s* includes removing a portion of the dielectric film 548 in the array 105 and exposing the semiconductor material of the substrate 101.

The patterning of the first dielectric layer 232 can be implemented using the same mask (not shown) as the patterning of the barrier layer 342. The patterning mask can be removed after etching the first dielectric layer 232. In some embodiments, the patterning of the first dielectric layer 232 can also use the barrier layer 342 as a hard mask. The etching of the first dielectric layer 232 can include dry etching, for example RIE using etchant such as $O_2/N_2/CF_4$, $NF_3$, $C_4F_8$, $CHF_3$, etc. and/or combinations thereof. In some embodiments, the etching of the first dielectric layer can also include wet chemical etching, for example, phosphorus acid, hydrofluoric acid or a mixture of hydrofluoric acid and ethylene glycol etc.

After forming the 3D memory structure 500, the sidewall of the first dielectric layer 232*s* is formed. Depending on the technique used for etching, the sidewall of the first dielectric layer 232*s* can be collinear with the sidewall of the barrier layer 342*s*. In some embodiments, the profile of the sidewall of the first dielectric layer 232*s* can include an undercut below the barrier layer 342 or an undercut above the top surface of the substrate 101*s* (see the dotted lines in the inset of FIG. 5). These undercuts can degrade the ability of the first dielectric layer 232 as a diffusion barrier for particles or ions, for example hydrogen ($H^+$) or oxygen ($O^{2-}$), etc. In addition, atomic bonding at the interface between two material layers can be weaker than the atomic bonding inside one material layer. Accordingly, particles or ions can diffuse along the top surface 551 and bottom surface 553 of the first dielectric layer 232. If fabricating a 3D memory array using the memory structure 500, the peripheral MOSFET 107 can suffer higher leakage current if a distance "d" between the peripheral MOSFET 108 and the sidewall of the barrier layer 342*s* is less than 10 μm.

Figure 6:
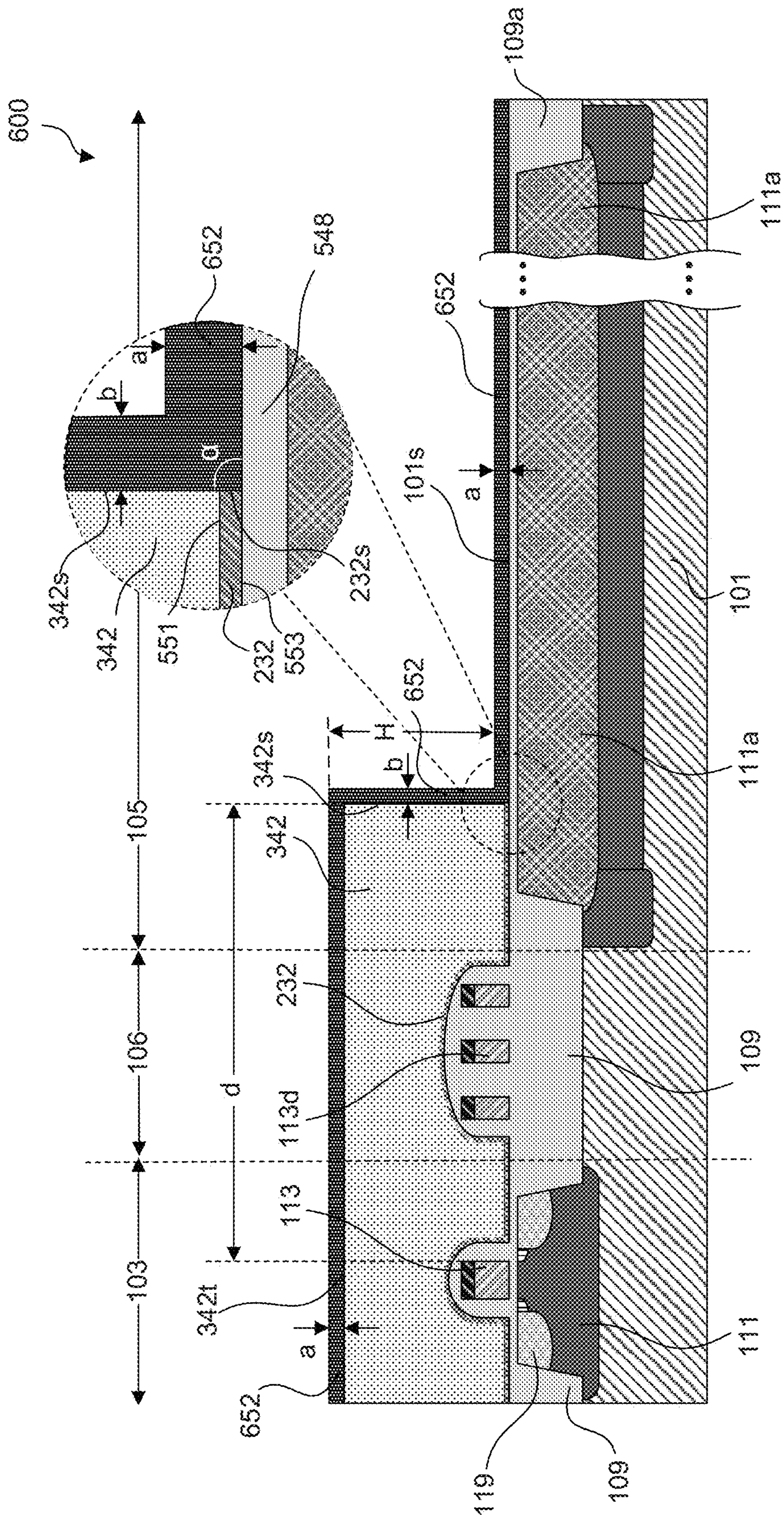
FIG. 6 illustrates a schematic cross-section view of an exemplary 3D memory structure covered with a second dielectric layer, in accordance with some embodiments of the present disclosure.

Referring to FIG. 6, a second dielectric layer 652 is disposed over the 3D memory structure 500 (shown in FIG. 5), covering all the surfaces of the structure 500, with a thickness "a" on the top surfaces of the remaining barrier layer 342*t* and the exposed top surfaces of substrate 101*s* in the memory array 105, and with a thickness "b" on the sidewall of the barrier layer 342*s*. The thickness "b" of the second dielectric layer 652 depends on the profile of the sidewall of the barrier layer 342*s*, the angle α, and/or the deposition technique used for the second dielectric layer 652. The thickness "b" of the second dielectric layer 652 can be thicker or thinner than the thickness "a" on a horizontal surface (e.g., the top surface of the barrier layer 342*t* and the top surface of the substrate 101*s*). In some embodiments, the thickness "b" of the second dielectric layer 652 can be the same as the thickness "a," and is so-called a "conformal" deposition on the 3D memory structure 500. The thickness "a" of the second dielectric layer 652 can be in a range between about 20 nm to about 200 nm. In some embodiments, the thickness "a" of the second dielectric layer 652 can be in a range between about 40 nm to about 60 nm. The height "H" of the second dielectric layer 652 depends on the thickness of the barrier layer 342 and/or the first dielectric layer 232. In some embodiments, the height “H” of the second dielectric layer 652 is greater than the thickness “a” of the second dielectric layer 652 on a horizontal surface.

In some embodiments, the second dielectric layer 652 can include any suitable insulating materials, for example, silicon nitride, silicon oxynitride, or silicon oxide, an/or combinations thereof. In some embodiments, the second dielectric layer 652 can also include high-k dielectric materials, for example, hafnium oxide, zirconium oxide, aluminum oxide, tantalum oxide, or lanthanum oxide films. In some embodiments, the second dielectric layer 652 can also include semiconductor materials, for example, amorphous silicon or polycrystalline silicon, etc. The second dielectric layer 652 can include one or more material layers and form material stacks. The techniques used for disposing the second dielectric layer 652 can include any suitable deposition methods such as, CVD, PVD, PECVD, LPCVD, RTCVD, sputtering, MOCVD, ALD, CVD using a furnace system, and/or combinations thereof.

In some embodiments, the disposing of the second dielectric layer 652 includes disposing the second dielectric layer 652 on the sidewall of the first dielectric layer **232*s* (see the inset of FIG. 6). The second dielectric layer 652 can be in direct contact with the first dielectric layer 232. In some embodiments, the second dielectric layer 652 can also fill a portion of the possible undercuts on the top and/or bottom surfaces 551/553 of the first dielectric layer 232*s*. In some embodiments, the interface between the first dielectric layer 232 and the second dielectric layer 652** includes no air gaps.

Figure 7A:
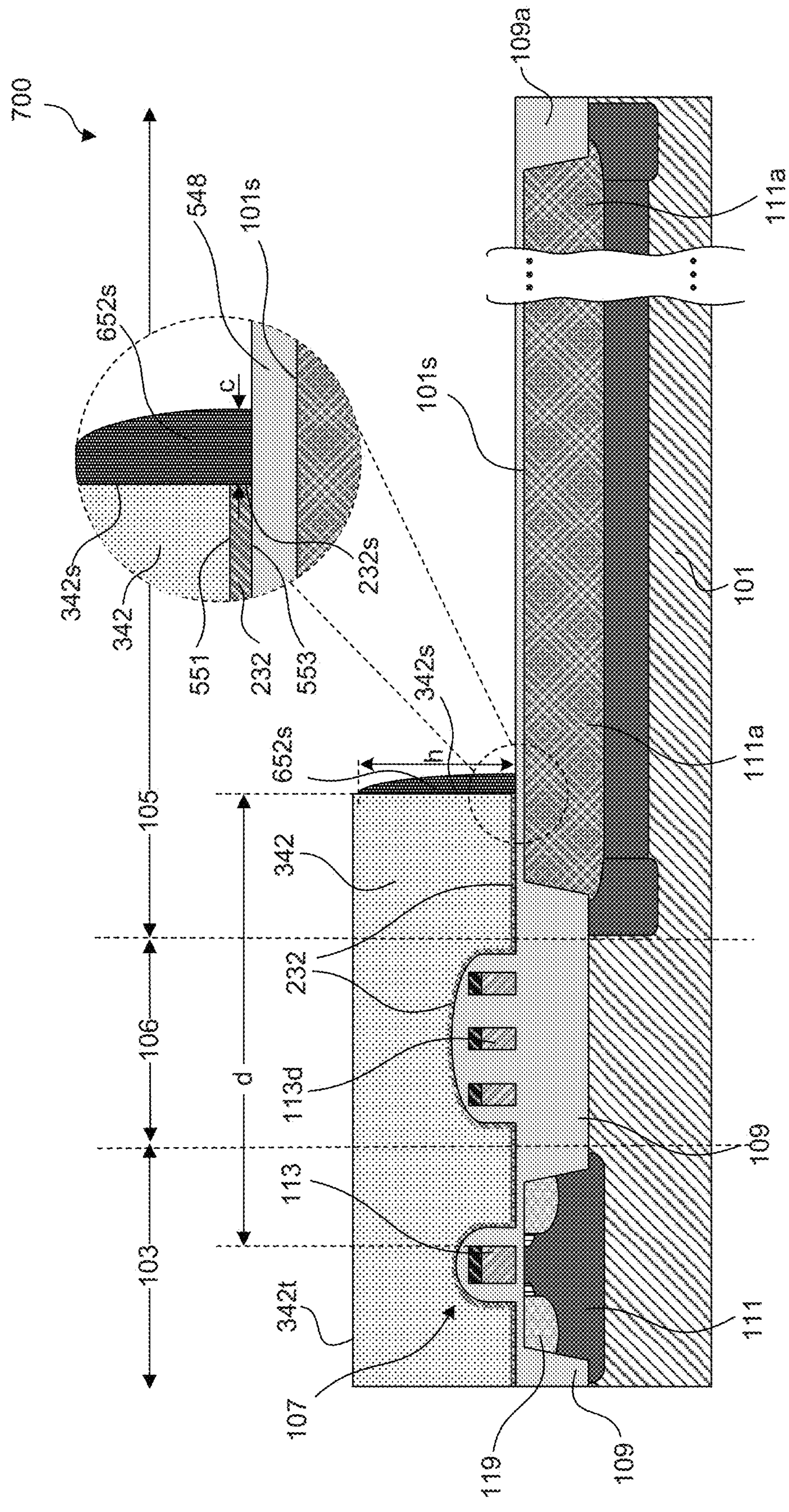
FIG. 7A-7F illustrate schematic cross-section views of exemplary 3D memory structures, in accordance with some embodiments of the present disclosure.

Referring to FIG. 7A, the second dielectric layer 652 on the horizontal surfaces (e.g., the top surface of the barrier layer **342*t* and the top surface of the substrate 101*s*) is removed using anisotropic etching, forming a dielectric spacer 652*s* on the sidewall of the barrier layer 342*s* and the sidewall of the first dielectric layer 232*s*. As used herein, the dielectric spacer also refers to a “protective spacer.” A 3D memory structure 700 includes the array 105 with the exposed top surface 101*s* and the periphery 103 protected by the first dielectric layer 232, the barrier layer 342 and the dielectric spacer 652*s*. The location of the dielectric spacer 652*s* corresponds to the location of the sidewall of the barrier layer 342*s*, and can be defined by design layout and lithography at the patterning of the barrier layer 342. In some embodiments, the location of the dielectric spacer 652*s* can be at the outer edge of the periphery 103. To obtain greater protection of the periphery, the dielectric spacer 652*s* can be placed in the boundary 106 or in the array 105**.

The anisotropic etching for the forming of the dielectric spacer **652*s* can include dry etching, for example RIE, using etchant such as $O_2/N_2/CF_4$, $NF_3$, $CHF_3$, $C_4F_8$, and/or combinations thereof. Anisotropic RIE can include low-pressure plasma system to increase mean-free path of the ions and reduce random scattering. During anisotropic etching, the ions strike the 3D memory structure 700 in a vertical direction, perpendicular to the top surface of the substrate 101*s*. In some embodiment, the height “H” (shown in FIG. 6) of the second dielectric layer 652 can be greater than the thickness “a” of the second dielectric layer 652 on a horizontal surface (e.g., the top surface of the barrier layer 342*t* and the top surface of the substrate 101*s*). Therefore, the second dielectric layer 652 on a horizontal surface can be removed, while there is remaining second dielectric layer 652 on the sidewall of the barrier layer 342*s*, forming the dielectric spacer 652*s* with a height “h” and a bottom thickness “c” next to the first dielectric layer 232. As used herein, the bottom thickness “c” of the dielectric spacer 652*s*** also refer to “thickness” for simplicity.

The height “h” and the thickness of the dielectric spacer **652*s* depend on the thickness of the barrier layer 342 and initial sidewall thickness “b” of the second dielectric layer 652. The height “h” and the thickness of the dielectric spacer 652*s* can also depend on the sidewall profile of the barrier layer 342*s*. The height “h” and the thickness of the dielectric spacer 652*s* can further depend on the RIE process conditions, for example, over-etch time, ion direction angle, pressure, DC bias voltage and RF power, etc. To protect the peripheral circuits, greater thickness of the dielectric spacer 652*s* is preferred. In some embodiments, the dielectric spacer 652*s*** have a thickness in a range between about 40 nm to about 60 nm.

After forming the dielectric spacer **652*s*, the peripheral devices, for example peripheral MOSFET 107, can be placed much closer to the array 105 without performance or reliability degradation. In some embodiments, the distance “d” from the gate stack 113 of the peripheral MOSFET 107 to the sidewall of the dielectric spacer 652*s*** can be less than about 10 μm without having negative impact on the peripheral device. As used herein, the distance “d” also refers to the distance between a peripheral device and a memory array. In some embodiments, the distance “d” between the peripheral devices and the memory array can be less than about 5 μm. In some embodiments, the distance “d” between the peripheral devices and the memory array can be less than about 3 μm.

In some embodiments, the dielectric spacer **652*s* is formed on the sidewall of the first dielectric layer 232*s* and the sidewall of the barrier layer 342*s*, blocking possible diffusion of particles or ions laterally along the top surface 551 and/or bottom surface 553 of the first dielectric layer. In some embodiments, the dielectric spacer 652*s* can also be formed on a top surface of the substrate 101*s*, wherein the top surface of the substrate 101*s* is covered by the dielectric film 548, for example silicon oxide, formed during the fabrication of peripheral devices (see the inset of FIG. 7**A).

In some embodiments, the portion of dielectric film 548 in the array 105 can be removed prior to disposing the second dielectric layer 652. In this example, the dielectric spacer **652*s* can also be formed on a sidewall of the dielectric film 548*s* (see FIG. 7B) and on the top surface of the substrate 101*s*, wherein the top surface of the substrate 101*s* can include the semiconductor material of the substrate 101**.

Figure 7D:
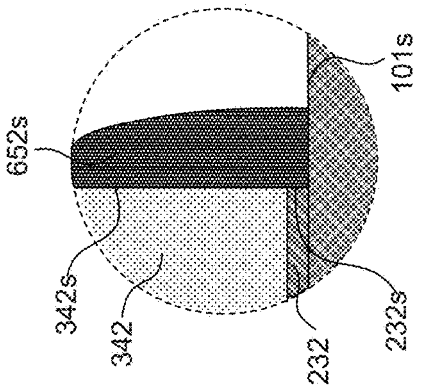
Figure 7C:
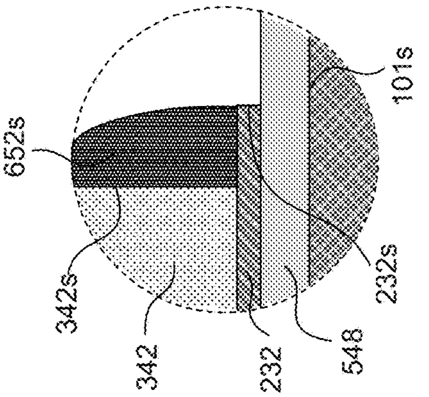
Figure 7B:
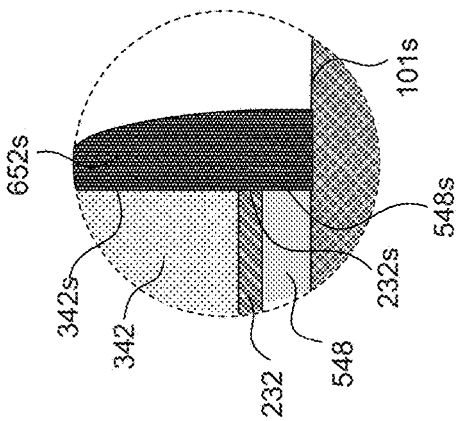

In some embodiments, the dielectric spacer **625*s* can be formed on the sidewall of the barrier layer 342*s* and on a top surface of the first dielectric layer 232 (see FIG. 7C). In this example, the patterning of the barrier layer 342 is followed by the second dielectric layer 652 deposition. After forming the dielectric spacer 652*s* on the sidewall of the barrier layer 342*s*, a portion of the first dielectric layer 232 in the array 105 can be removed. The removing of the first dielectric layer 232 can include dry etching using the barrier layer 342 and the dielectric spacer 652*s*** as patterning hard masks.

In some embodiments, the dielectric film 548 can be removed after forming the peripheral devices and prior to disposing the first dielectric layer 232 (see FIG. 7D). In this example, the first dielectric layer 232 can be formed directly on the top surface of the substrate **101*s*, wherein the top surface of the substrate 101*s* includes semiconductor material of the substrate 101. In this example, the dielectric spacer 652*s* is formed on the sidewalls of the barrier layer 342*s* and the first dielectric layer 232*s*, and on the top surface of the substrate 101*s***.

Figure 7F:
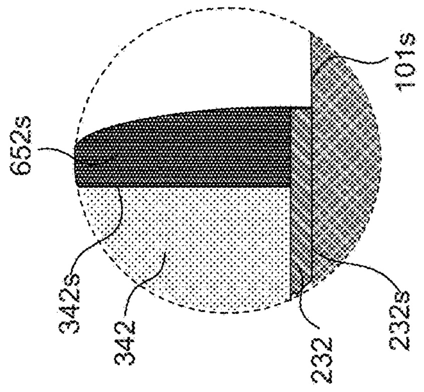
Figure 7E:
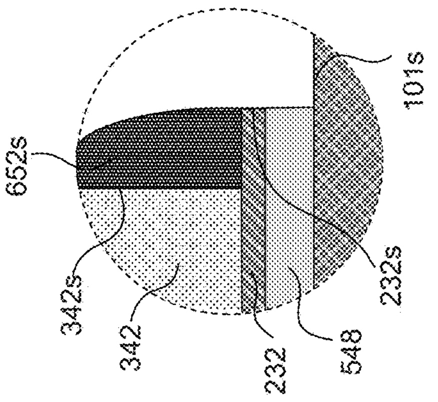

In some embodiments, after forming the protective structure shown in FIG. 7C, a portion of the dielectric film 548 can be removed prior to the fabrication processes for 3D memory array, exposing a portion of the top surface of the substrate 101*s*. An exemplary structure is shown in FIG. 7E. The top surface of the substrate 101*s* can include the semiconductor material of the substrate 101, such as silicon or silicon germanium, etc. The removing of the portion of the dielectric film 548 can include techniques such as dry etching or wet chemical etching, similar to the techniques used to etch barrier layer 342.

In some embodiments, the dielectric film 548 can be formed directly on the top surface of the substrate 101*s* when the dielectric film 548 is removed after forming the peripheral devices and prior to disposing the first dielectric layer 232. The dielectric spacer 652*s* can also be formed on top of the first dielectric layer 232 as shown in FIG. 7F. In this example, the etching of the first dielectric layer 232 is performed after the formation of the dielectric spacer 652*s* using similar techniques as described in FIG. 7C.

After forming the 3D memory structure 700 (in FIG. 7A-7F), fabrication of the 3D memory array can resume starting with, for example, forming a bottom barrier layer and a plurality of alternatingly arranged dielectric layer stacks.

Figure 8:
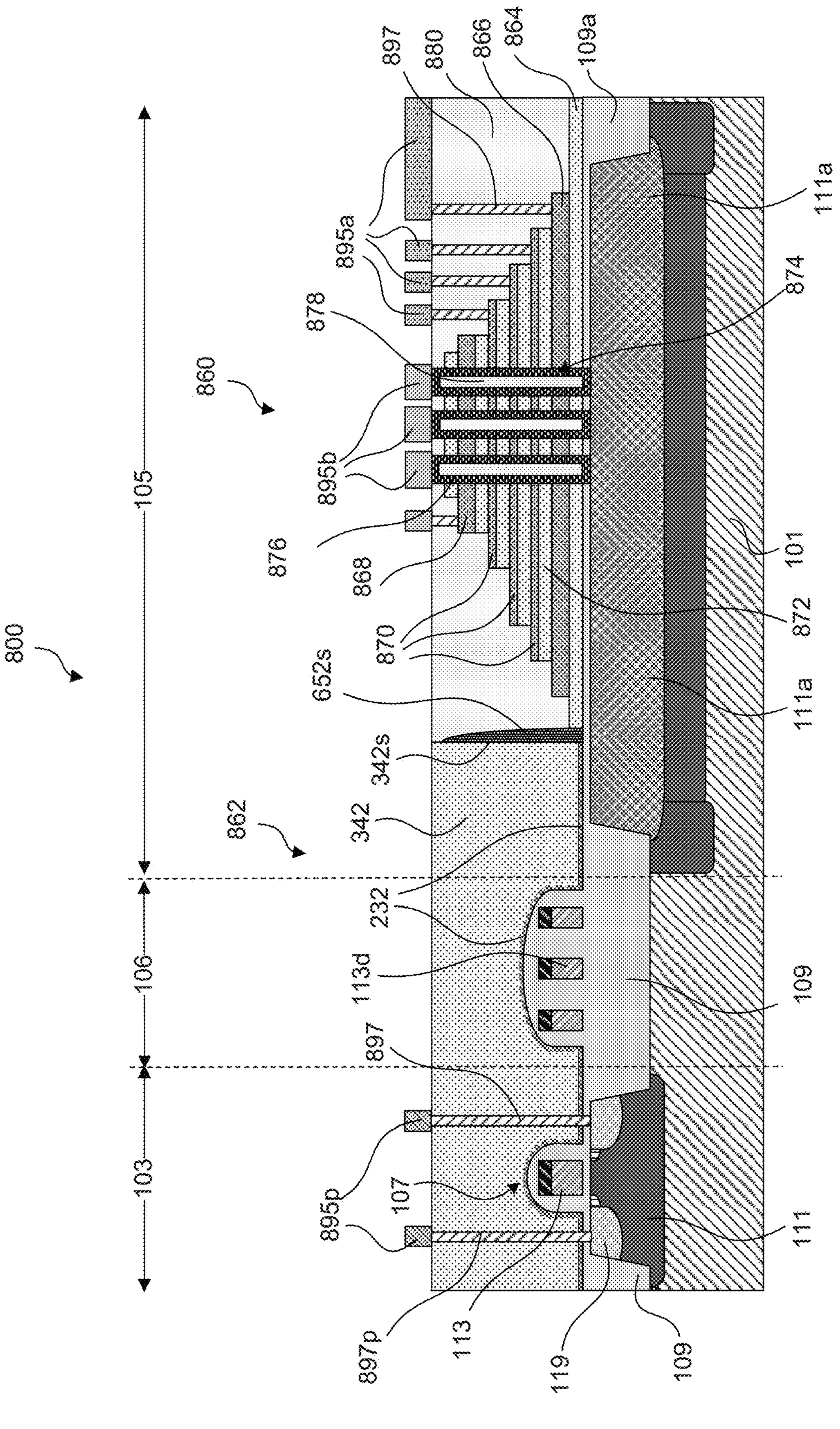
FIG. 8 illustrates a schematic cross-section view of an exemplary 3D memory device including an array, a periphery and a protective structure, in accordance with some embodiments of the present disclosure.

FIG. 8 illustrate a cross-sectional view of an exemplary semiconductor memory device 800. A semiconductor memory device 800 includes the substrate 101 having the first region 103 with peripheral devices such as the peripheral MOSFET 107, the second region 105 with one or more memory arrays such as a 3D array structure 860, and the third region 106 between the first and the second regions. The semiconductor memory device 800 also includes a protective structure 862, wherein the protective structure 862 includes the first dielectric layer 232 and the barrier layer 342 disposed on the first dielectric layer 232. The first dielectric layer 232 and the barrier layer 342 each can have sidewalls 232*s*/342*s*. The protective structure 862 further includes the dielectric spacer 652*s* formed on the sidewalls of the barrier layer 342*s* and the first dielectric layer 232*s*. The protective structure 862 can be disposed over the first region 103 and at least a portion of the third region 106. In some embodiments, the protective structure 862 can be disposed over the first region 103, third region 106 and at least a portion of the second region 105. Accordingly, the dielectric spacer 652*s* can be placed in the active device region in the array 105 (as shown in FIG. 8). The dielectric spacer 652*s* can also be placed on the isolation structures of STI 109 in the array 105 or in the boundary 106 between periphery 103 and array 105.

In some embodiments, the protective structure 862 can include the first dielectric layer 232 and the barrier layer 342 disposed on the first dielectric layer 232, wherein the barrier layer 342 can have the sidewall 342*s*. The protective structure 862 can further include the dielectric spacer 652*s* formed on the sidewall of the barrier layer 342*s* and on a top surface of the first dielectric layer 232, wherein the protective structure 862 is disposed over the first region 103 and at least a portion of the third region 106.

The 3D array structure 860 includes a bottom barrier layer 864 over the active device area in the array (e.g., array well 111*a*), a tier of lower selective gate electrodes 866 over the bottom barrier layer 864, and a plurality of tiers of control gate electrodes 870 stacking on top of lower selective gate electrodes 866 to form an alternating conductor/dielectric stack. The memory device also includes a tier of upper selective gate electrodes 868 lies over the stack of control gate electrodes 870. Between adjacent tiers of gate electrodes are dielectric layers 872. The memory device further includes doped source line regions (not shown) in portions of substrate 101 between adjacent lower selective gate electrodes 866, and memory strings 874 through upper selective gate electrodes 868, control gate electrodes 870, lower selective gate electrodes 866, and bottom barrier layer 864. Memory strings 874 includes a semiconductor layer 876 over the inner surface of memory strings 874 and a core filling film 878 surrounded by semiconductor layer 876. The memory strings 874 can also include a memory film at the interface between the semiconductor layer 876 and the control gate electrodes 870. The 3D array structure 860 further includes an insulating material 880, a plurality of bit lines 895*b* connected to memory strings 874 over upper selective gate electrodes 868 and a plurality of metal interconnects 895*a* connected to the gate electrodes through a plurality of metal contacts 897. The gate electrodes include upper selective gate electrodes 868, control gate electrodes 870 (e.g., also referred to as the word lines), and lower selective gate electrodes 866.

In FIG. 8, for illustrative purposes, three tiers of control gate electrodes 870 are shown together with one tier of upper selective gate electrodes 868 and one tier of lower selective gate electrodes 866. The tiers of control gate electrodes and the number of memory cells that stacked on a memory string can be changed. The 3D array structure 860 can include other structures, for example, through array contacts, gate line slits, etc., that are known to those skilled in the art and are not shown in FIG. 8. During the fabrication of metal contacts and metal interconnects for the 3D array structure 860, metal contacts 897*p* and metal interconnects 895*p* for the peripheral devices can be formed simultaneously.

Figure 9:
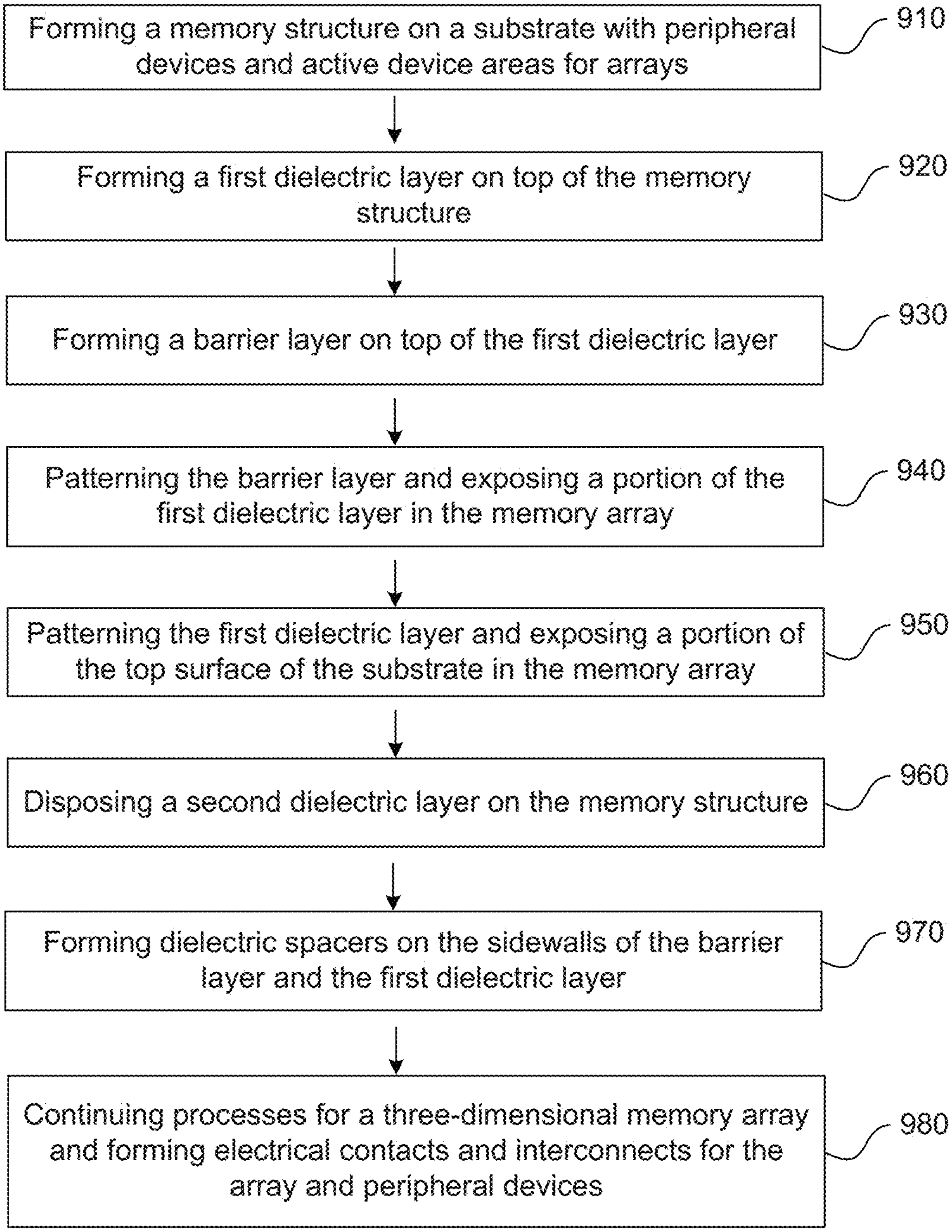
FIG. 9 illustrates a flow diagram of an exemplary method for forming protective structures of a 3D memory device, according to some embodiments of the present disclosure.

FIG. 9 illustrates an exemplary method for forming protective structures for the peripheral circuits and devices for a three-dimensional memory, according to some embodiments. The processing steps of the method 900 can be used to form memory device structures illustrated in FIGS. 1-8. The processing steps shown in method 900 are not exhaustive and other processing steps can be performed as well before, after, or between any of the illustrated process steps. In some embodiments, some processing steps of exemplary method 900 can be omitted or other processing steps not described here for simplicity can be added. In some embodiments, processing steps of method 900 can be performed in a different order and/or vary.

At process step 910, peripheral devices of a semiconductor memory device are formed in a first region and active device areas are formed in a second region on a substrate. One or more isolation structures are also formed simultaneously in a third region between the first and the second regions. The first region can be the first region or the periphery 103 shown in FIG. 1, the second region can be the second region or the array 105, the third region can be the third region or the boundary 106, and the substrate can be the substrate 101. The peripheral devices includes metal oxide semiconductor field effect transistors (MOSFETs), diodes, capacitors, resistors, etc., wherein the MOSFETs can be one or more of the MOSFET 107 illustrated in FIG. 1. The fabrication of a MOSFET is known to those skilled in the art and is summarized here as reference. The front-end-of-line processes for a MOSFET includes active device area pattering, insulator filling and polishing to form shallow trench isolations (STIs), well implantation and dopant activation annealing, gate dielectric and gate conductive material deposition, gate stack pattering, source/drain extension/halo implantation and activation annealing, gate spacer deposition and anisotropic etching, source/drain implantation and activation annealing, and silicide formation.

The peripheral MOSFET can also be fabricated on a "FIN" shaped active device region and be a so-called "FINFET." The process of a FINFET includes additional steps of forming one or more FINs and a gate stack wrapping around the FINs. Fabrication of the peripheral MOSFET can also follow a replacement gate scheme, where a sacrificial gate stack is formed first and then replaced by high-k/metal gate stack. Processes for performance enhancement can also be included in the fabrication of the peripheral MOSFET, for example, stress liner, uniaxial stress induced by source/drain SiGe or SiC epitaxy, etc. Peripheral devices such as diodes, resistors, capacitors, etc., can be fabricated simultaneously with the peripheral MOSFETs, or with some additional design levels and/or process steps.

At process step 910, the active device areas in the array and the isolation structures in the boundary can be formed simultaneously with the periphery devices by forming STI regions, similar to STI 109*a* in FIG. 1. The well implantation and dopant activation annealing for the memory array can also be performed simultaneously with the peripheral devices. The wells for a memory array can include p-wells for high voltage application and deep n-wells below the p-wells for electrical isolation or independent well control (see an exemplary array well 111*a* in FIG. 1).

At process step 920, a first dielectric layer is disposed on the memory structure, over the periphery, the array and a boundary area between the periphery and the array. The first dielectric layer can be the first dielectric layer 232 in FIG. 2, such as silicon nitride, and can be disposed using similar techniques, such as chemical vapor deposition. The first dielectric layer can have a thickness between about 10 nm to about 100 nm, particularly between about 20 nm to about 40 nm.

At process step 930, a barrier layer is disposed on the first dielectric layer. The barrier layer can be the barrier layer 342 in FIG. 3, such as silicon oxide, and can be disposed using similar techniques, such as high density plasma chemical vapor deposition. The barrier layer can have a thickness in a range between about 0.2 μm to about 2 μm, in particular, between about 0.5 μm to about 0.9 μm.

At process step 940, a portion of the barrier layer is removed from the array region to form a sidewall and a remaining portion of the barrier layer. A portion of the first dielectric layer in the array is exposed. The sidewall can be the sidewall of the barrier layer 342*s* in FIG. 4. The removing of a portion of the barrier layer includes lithography and patterning with a mask (e.g., photoresist, hard mask, etc.). Techniques such as dry etching, for example reactive ion etching (RIE) with $CF_4$, $CHF_3$, $C_2F_6$, or $C_3F_6$, etc., can be used to etch the barrier layer. Wet chemical such as HF, buffered-oxide-etchant (BOE), etc, can be used as a touch-up etching in a combination with the RIE. During the etching of the barrier layer, the first dielectric layer can function as an etch-stop to protect the top surface of the substrate in the array area.

At process step 950, a portion of the first dielectric layer is removed from the array region to form a sidewall and a remaining portion of the first dielectric layer. A portion of the top surface of the substrate in the array is exposed. The sidewall can be the sidewall of the first dielectric layer 232*s* in FIG. 5. The etching of the first dielectric layer can include dry etching, for example RIE using etchant such as $O_2/N_2/CF_4$, $NF_3$, $C_4F_8$, $CHF_3$, etc. and/or combinations thereof. The etching of the first dielectric layer can also include wet chemical etching, for example, phosphorus acid, hydrofluoric acid or a mixture of hydrofluoric acid and ethylene glycol etc.

At process step 960, a second dielectric layer is disposed over the memory structure, e.g., on the remaining portion of the barrier layer, the sidewalls of the barrier layer and the first dielectric layer and the exposed portion of the top surface of the substrate. The second dielectric layer can be the second dielectric layer 652 in FIG. 6, such as silicon nitride, and can be disposed using similar techniques, such as plasma enhanced chemical vapor deposition or any chemical vapor deposition using a furnace system.

At process step 970, a dielectric spacer is formed on the sidewalls of the remaining portion of the barrier layer and the first dielectric layer. The dielectric spacer can be the dielectric spacer 652*s* in FIG. 7A. The forming of the dielectric spacer can include anisotropic etching, for example, RIE with etchant such as $O_2/N_2/CF_4$, $NF_3$, $CHF_3$, $C_4F_8$, and/or combinations thereof. In some embodiments, the dielectric spacer has a thickness in a range between about 40 nm to about 60 nm.

In some embodiments, the dielectric spacer is formed on the sidewalls of the barrier layer and the first dielectric layer and on top of a dielectric film on the substrate (see the inset of FIG. 7A), wherein the dielectric film can be the dielectric film 548 in FIG. 7A, and can be formed on the top surface of the substrate in the array area during the fabrication of the peripheral devices such as STI, gate dielectric or gate spacer.

In some embodiments, the dielectric film on the top surface of the substrate in the array area can be removed after removing the portion of first dielectric layer in the array at process step 950. A portion of the top surface of the substrate can be exposed, wherein the top surface of the substrate include a semiconductor material of the substrate. A second dielectric layer can then be disposed on the remaining portion of the barrier layer, the sidewalls of the barrier layer, first dielectric layer and the dielectric film, and the exposed top surface of the substrate (similar to process step 960). The dielectric spacer can be formed on the sidewalls of the barrier layer, the first dielectric layer and the dielectric film, and on the top surface of the substrate at process step 970 (see FIG. 7B).

In some embodiments, the dielectric spacer can be formed on the sidewall of the barrier layer and on the top surface of the first dielectric layer (see. FIG. 7C). In this example, the second dielectric layer can be disposed after removing the portion of barrier layer in the array region at process step 940. After the dielectric spacer formation, a portion of the first dielectric layer in the array region can be removed, while the barrier layer and the dielectric spacer can be used as patterning hard mask. The process sequences can be modified as process step 940, 960, 970 and then 950.

In some embodiments, the dielectric spacer can be formed on the sidewalls of the barrier layer and the first dielectric layer and on a top surface of the substrate (see FIG. 7D), wherein the top surface of the substrate can include the semiconductor material of the substrate. In this example, a portion of the dielectric films formed during the fabrication of the peripheral devices, for example, during the process of STI, gate stack or gate spacer, etc., can be removed from the array region, prior to the first dielectric layer deposition at process step 920. At process step 920, the first dielectric layer can be disposed over the periphery and the exposed portion of the top surface of the substrate, followed by the remaining process steps described herein.

In some embodiments, the dielectric spacer can be formed on the sidewall of the barrier layer and on the top surface of the first dielectric layer, with a portion of the top surface of the substrate exposed (see FIG. 7E). The method for forming this structure first follows the process steps described herein for the structure described in FIG. 7C, e.g., with a process sequence similar to 940, 960, 970 and 950. After forming the dielectric spacer and removing a portion of the first dielectric layer in the array region, an etching process can be used to remove a portion of the dielectric film and expose a portion of the top surface of the substrate. The etching process can be any suitable dry etching, for example, reactive ion etching (RIE) with $CF_4$, $CHF_3$, $C_2F_6$, or $C_3F_6$, etc. The etching process can also include wet chemical etching, such as hydrofluoric acid, or any combination of dry and wet etching. The barrier layer, the dielectric spacer and/or the first dielectric layer can be used as hard masks for this etching.

In some embodiments, the dielectric spacer can be formed on the sidewall of the barrier layer and on the top surface of the first dielectric layer, wherein the first dielectric layer can be formed directly on the top surface of the substrate (see FIG. 7F). To fabricate this structure, a portion of the dielectric film can be removed from the array region, prior to the first dielectric layer deposition. Also, a portion of the first dielectric layer in the array region can be removed after forming the dielectric spacer, similar to the method described herein for the structure shown in FIG. 7C.

At process step 980, fabrication for a three-dimensional memory array are resumed with processes such as disposing a bottom barrier layer, forming a staircase structure with an alternating dielectric stack, forming vertical memory channels and memory films through the alternating dielectric stack, forming gate line slits and replacing the alternating dielectric stack with an alternating conductor/dielectric stack, and forming metal contacts/interconnects for the array and peripheral devices. An exemplary three dimensional memory device is shown in FIG. 8.

In some embodiments, a semiconductor memory device includes a substrate having a first region with peripheral devices, a second region with one or more memory arrays, and a third region between the first and the second regions. The semiconductor memory device also includes a protective structure for peripheral devices. The protective structure for peripheral devices of the semiconductor memory device includes a first dielectric layer and a barrier layer disposed on the first dielectric layer. The protective structure for peripheral devices of the semiconductor memory device further includes a dielectric spacer formed on a sidewall of the barrier layer and a sidewall of the first dielectric layer, wherein the protective structure is disposed over the first region and at least a portion of the third region.

In some embodiments, a semiconductor memory device includes a substrate having a first region with peripheral devices, a second region with one or more memory arrays, and a third region between the first and the second regions. The semiconductor memory device also includes a protective structure for peripheral devices. The protective structure for peripheral devices of the semiconductor memory device includes a first dielectric layer and a barrier layer disposed on the first dielectric layer. The protective structure for peripheral devices of the semiconductor memory device further includes a dielectric spacer formed on a sidewall of the barrier layer and on a top surface of the first dielectric layer, wherein the protective structure is disposed over the first region and at least a portion of the third region.

In some embodiments, a method for forming a semiconductor memory device includes forming peripheral devices in a first region on a substrate and forming active device areas in a second region on the substrate. The method for forming the semiconductor memory device also includes forming one or more isolation structures in a third region between the first and the second regions. The method for forming the semiconductor memory device further includes forming a protective structure for peripheral devices, wherein the protective structure includes the dielectric spacer and remaining portions of the first dielectric layer and the barrier layer, and is disposed over the first region and at least a portion of the third region. The method for forming the semiconductor memory device further includes forming one or more memory arrays in the second region on the substrate.

In some embodiments, the method for forming the protective structure for peripheral devices of the semiconductor memory device also includes disposing a first dielectric layer on the substrate and disposing a barrier layer on the first dielectric layer. The method further includes removing a portion of the barrier layer from the second region to form a sidewall, exposing a portion of the first dielectric layer. The method also includes removing the exposed portion of the first dielectric layer to form a sidewall, exposing a portion of a top surface of the substrate. The method further includes disposing a second dielectric layer on a remaining portion of the barrier layer, the sidewalls of the barrier layer and the first dielectric layer, and the exposed portion of the top surface of the substrate. The method further includes forming a dielectric spacer on the sidewalls of the barrier layer and the first dielectric layer.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a semiconductor memory device, comprising:

forming peripheral devices in a first region on a substrate;

forming active device areas in a second region on the substrate;

forming one or more isolation structures in a third region between the first and the second regions;

forming a protective structure for the peripheral devices over the first region and at least a portion of the third region; and after forming the protective structure, forming an alternating conductor/dielectric stack to form one or more memory arrays in the second region.

2. The method of claim 1, wherein the forming of the protective structure comprises:

disposing a first dielectric layer on the substrate;

disposing a barrier layer on the first dielectric layer;

forming a first sidewall of the barrier layer;

disposing a second dielectric layer on the substrate; and forming a dielectric spacer on the first sidewall of the barrier layer.

3. The method of claim 2, wherein the forming the first sidewall of the barrier layer comprises:

removing a portion of the barrier layer such that the first sidewall of the barrier layer is located in the second region.

4. The method of claim 3, wherein the forming the first sidewall of the barrier layer comprises:

removing a portion of the barrier layer such that the first sidewall of the barrier layer is located in the third region.

5. The method of claim 2, wherein the forming the first sidewall of the barrier layer comprises:

removing a portion of the barrier layer to expose the first dielectric layer.

6. The method of claim 2, further comprising:

after forming the first sidewall of the barrier layer, removing a portion of the first dielectric layer to form a second sidewall of the first dielectric layer; and forming the dielectric spacer on the second sidewall of the first dielectric layer.

7. The method of claim 2, further comprising:

after forming the dielectric spacer on the first sidewall of the barrier layer, removing a portion of the first dielectric layer to form a second sidewall of the first dielectric layer.

8. The method of claim 2, wherein the disposing of the second dielectric layer comprises depositing silicon nitride or silicon oxynitride.

9. The method of claim 2, wherein the disposing of the second dielectric layer comprises depositing a high-k dielectric material.

10. The method of claim 9, wherein the depositing the high-k dielectric material comprises depositing hafnium oxide, zirconium oxide, aluminum oxide, tantalum oxide, or lanthanum oxide.

11. The method of claim 2, wherein the forming of the dielectric spacer on the first sidewall of the barrier layer comprises anisotropic etching of the second dielectric layer.

12. The method of claim 2, wherein the forming of the dielectric spacer comprises forming the dielectric spacer of a thickness in a range between about 40 nm to about 60 nm.

13. The method of claim 2, further comprising:

after disposing the barrier layer, planarizing the barrier layer using chemical mechanical polishing.

14. The method of claim 2, wherein the disposing the barrier layer comprises disposing the barrier layer with a thickness in a range between about 0.2 μm to about 2 μm.

15. The method of claim 2, wherein the disposing the barrier layer comprises disposing silicon oxide.

16. The method of claim 2, wherein the disposing the first dielectric layer comprises disposing silicon nitride or silicon oxynitride.

17. The method of claim 1, wherein the forming the one or more memory arrays comprises forming the one or more memory arrays with a distance less than 10 μm from the peripheral devices.

18. The method of claim 1, wherein the forming the one or more memory arrays comprises forming the one or more memory arrays with a distance less than 5 μm from the peripheral devices.

19. The method of claim 1, wherein the forming the one or more memory arrays comprises forming the one or more memory arrays with a distance less than 3 μm from the peripheral devices.

20. A method for forming a semiconductor memory device, comprising:

forming peripheral devices in a first region on a substrate;

forming active device areas in a second region on the substrate;

forming one or more isolation structures in a third region between the first and the second regions;

disposing a first dielectric layer and a barrier layer on the substrate covering the first region, the second region and the third region;

forming a first sidewall of the barrier layer;

disposing a second dielectric layer on the substrate to cover the first sidewall of the barrier layer;

forming a dielectric spacer on the first sidewall of the barrier layer to form a protective structure for the peripheral devices over the first region and at least a portion of the third region; and forming one or more memory arrays in the second region.

* * * * *